United States Patent [19]
Hauge et al.

[11] Patent Number: 5,847,585
[45] Date of Patent: Dec. 8, 1998

[54] METHOD AND APPARATUS FOR DEVELOPING A CLOSE FREQUENCY TOLERANCE OUTPUT SIGNAL FROM AN INPUT SIGNAL OF LESSER FREQUENCY TOLERANCE

[75] Inventors: Raymond C. Hauge, Fox River Grove; Dennis M. Mutzabaugh, Mount Prospect, both of Ill.

[73] Assignee: Zenith Electronics Corporation, Glenview, Ill.

[21] Appl. No.: 734,224

[22] Filed: Oct. 21, 1996

[51] Int. Cl.⁶ .................................................. H03B 21/00
[52] U.S. Cl. .......................... 327/105; 327/113; 327/361; 455/71
[58] Field of Search ...................... 327/105, 113, 327/114, 551, 355, 361; 331/175; 455/71, 502, 503, 318; 348/470

[56] References Cited

U.S. PATENT DOCUMENTS

| 4,320,533 | 3/1982 | Hashima | 455/259 |
| 4,442,406 | 4/1984 | Vose | 327/42 |
| 4,581,749 | 4/1986 | Carney et al. | 455/44 |
| 4,912,773 | 3/1990 | Schiff | 455/71 |
| 5,115,515 | 5/1992 | Yamamoto et al. | 455/71 |
| 5,311,318 | 5/1994 | Dobrovolny | 455/164.2 |
| 5,388,125 | 2/1995 | Toda et al. | 455/318 |
| 5,584,062 | 12/1996 | Meador et al. | 331/23 |

*Primary Examiner*—Timothy P. Callahan
*Assistant Examiner*—Terry L. Englund

[57] ABSTRACT

An input signal of frequency tolerance A is combined with a reference first signal having a frequency tolerance B to develop a second signal having a combined frequency tolerance of −A and B . The input signal is combined with the second signal to offset and cancel the A and −A frequency tolerances to produce an output signal having a B frequency tolerance.

6 Claims, 1 Drawing Sheet

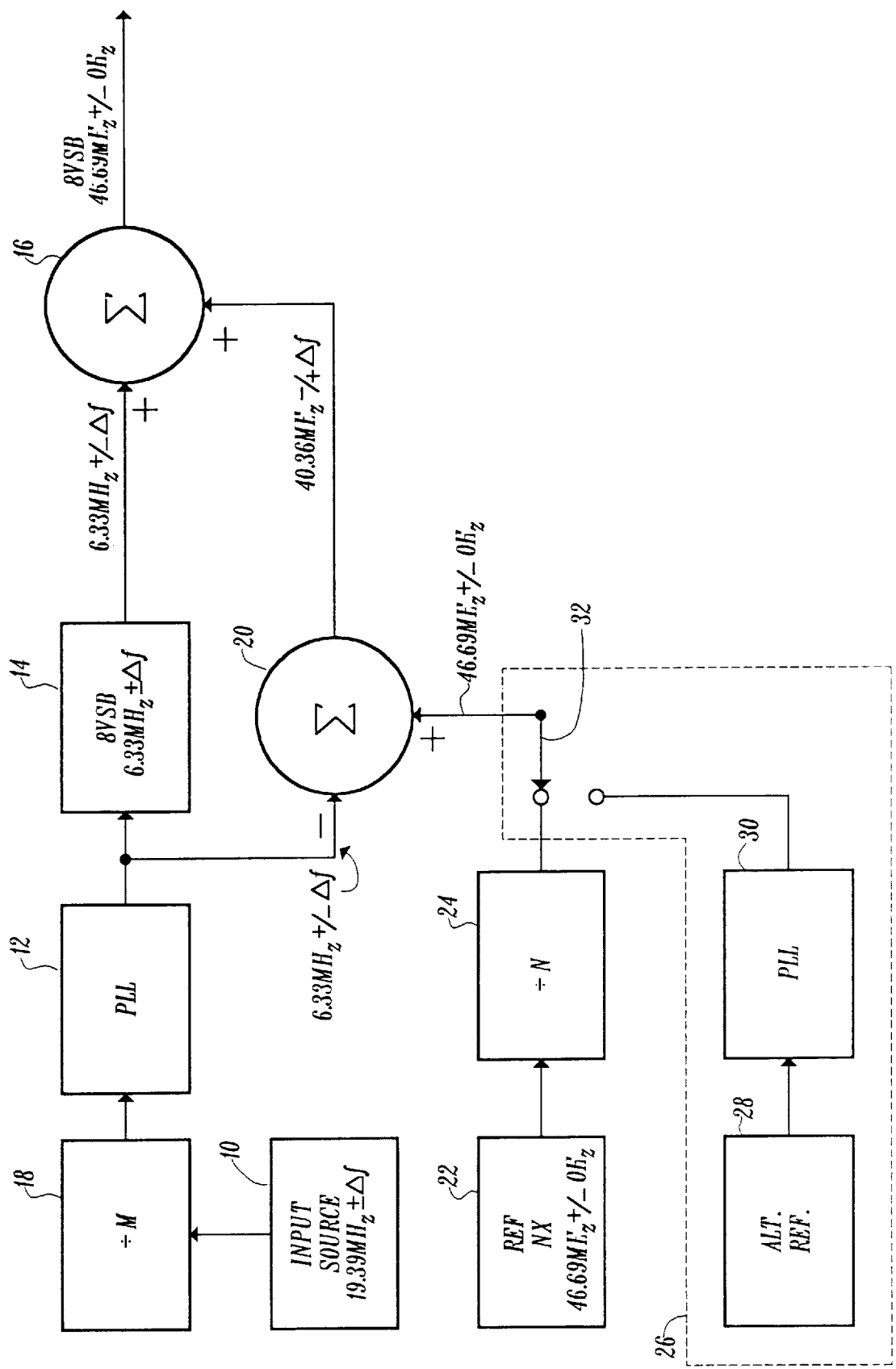

METHOD AND APPARATUS FOR DEVELOPING A CLOSE FREQUENCY TOLERANCE OUTPUT SIGNAL FROM AN INPUT SIGNAL OF LESSER FREQUENCY TOLERANCE

BACKGROUND OF THE INVENTION AND PRIOR ART

This invention relates generally to techniques and apparatus for producing a close tolerance output signal from a relatively wide tolerance input signal and specifically for developing a highly stable HDTV (high definition television) VSB (vestigial sideband) symbol clock and IF frequency from a data stream of relatively lower stability.

Recently, the VSB transmission system has been standardized for both digital broadcast and cable transmissions. In broadcast use, the system is designed to operate in close proximity to other signal sources, both HDTV and NTSC. In instances of two same channel HDTV signals of slightly overlapping signal areas, a precision offset is employed to displace their respective carrier frequencies by a precise amount and thereby minimize interference. Such capability requires that the RF frequencies of the signals be precisely controlled to within +/–1 Hz of their nominal offset frequency.

Difficulty arises in attempting to impose such stringent tolerance limits on the incoming data streams from various program sources that supply the transmitters that relay the signals to the various VSB modulators. It is also desirable to process these signals digitally as opposed to doing so in analog form. The difficulty is that the transmitters generally do not control their frequencies to less than +/–20 Hz. The HDTV IF frequency of 46.69 MHz may be divided down to 6.33 MHz and upconverted after the various processing has been completed digitally. The input from the program source is similarly divided (19.39 MHz to 6.33 MHz). In so doing, a tolerance of +/–20 Hz becomes a tolerance of +/–7 Hz, which is still much too high to maintain an offset frequency tolerance of +/–1 Hz.

It will be appreciated that imposing very stringent tolerance limits on the originating program sources would be very costly and somewhat impractical due to the wide variety of sources involved, e.g. cameras, tape recorders, computers, etc. The present invention obviates these problems in a simple, cost effective manner.

OBJECTS OF THE INVENTION

A principal object of the invention is to provide a novel method and apparatus for developing a close tolerance output signal from a wider tolerance input signal.

A further object of the invention is to provide a high precision symbol clock and IF frequency from a lower precision input source.

BRIEF DESCRIPTION OF THE DRAWING

These and other objects and advantages of the invention will be apparent upon reading the following description thereof in conjunction with the drawing, the single FIGURE of which is a partial schematic diagram illustrating operation of the invention.

DESCRIPTION OF THE PREFERRED EMBODIMENT

As discussed above, the input signal may come from any of a variety of sources that supply data at a 19.39 MHz frequency. The tolerance A on the input signal clock frequency may be +/–20 Hz, and while that is fairly good stability, for the reasons mentioned above, it is not sufficient for precision offsetting of VSB signals. The input signal source is indicated by reference 10, which is coupled, through a divider 18, to a PLL (phase locked loop) 12. The PLL supplies a block 14 which develops an 8 VSB 6.33 MHz +/–7 Hz IF signal, also as discussed above. The 8 VSB signal is defined by symbols that have any one of eight different symbol levels. This IF signal is applied to an adder 16. In order to produce the 6.33 MHz IF signal, the input signal of 19.39 MHz from block 10 is divided by a factor M as indicated in block 18. The output of PLL 12 is also coupled to an adder 20 that, in turn, has its output coupled to an input of adder 16.

A very stable reference source 22 is provided for developing a frequency of N times 46.69 MHz +/–0 Hz. The N factor is used to avoid interference problems that might occur by developing the frequency directly. The output of reference 22 is divided by N in a block 24 and applied to the positive input of adder 20, where the output of PLL 12 is subtracted therefrom. The result is an output from adder 20 that has a frequency of 40.36 MHz –/+7 Hz. It should be noted that the tolerance of +/–7 has been transformed into a tolerance of –/+7 by this process. In other words, tolerance A in the signal from PLL 12 has become tolerance –A in the output of adder 20. When the two signals are now combined in adder 16, the tolerance A is offset by the tolerance –A which results in an output signal of 46.69 MHz +/–0 Hz. By supplying a reference of the desired tolerance or stability B, the output signal has been made to take on the tolerance of the reference rather than that of the input signal.

As indicated by the dotted line block 26, an alternate reference source 28 and another PLL 30 may also be used and selectively switched by means of a switch 32 with the signal from reference 22. The alternate reference 28 can be a signal from a national source, a global positioning satellite, etc.

It will be appreciated that the tolerance B imposed by the reference (if other than +/–0) will be combined with the negative tolerance of the input signal in adder 20 with the result that the output signal from adder 16 will reflect that tolerance B, i.e. the tolerance B of the reference. The tolerance of the input signal will be cancelled by this technique. Therefore the output signal tolerance can be simply made to match a desired tolerance.

What has been described is a novel method and apparatus for generating a high tolerance output signal from a lower tolerance in put signal. It is recognized that numerous modifications and changes to the described embodiment of the invention will occur to those skilled in the art without departing from its true spirit and scope. The invention is to be limited only as defined in the claims.

What is claimed is:

1. A method of developing an output signal having a frequency tolerance B from an input signal having a frequency tolerance A, comprising:

generating a first signal having a frequency tolerance B;

developing a second signal having a combined frequency tolerance of –A and B, by combining the input signal and the first signal; and developing the output signal by cancelling the frequency tolerance A from the input signal with the frequency tolerance –A of the second signal.

2. The method of claim 1, wherein the output signal is an 8 VSB 46.69 MHz IF signal of substantially zero frequency tolerance.

3. The method of claim 2, further comprising:

dividing a signal of 19.39 MHz +/−20 Hz to provide the input signal at 6.33 MHz +/−7 Hz;

dividing a higher frequency reference signal to obtain the first signal of 46.69 MHz +/−0 Hz; and developing the second signal having a frequency of 40.36 MHz −/+7 Hz.

4. A method of developing a 46.69 MHz +1/−1 Hz output signal from a 19.39 MHz +20/−20 Hz input signal comprising:

producing a 6.33 MHz +7/−7 Hz signal from the input signal;

generating a reference signal of 46.69 MHz +1/−1 Hz;

developing a 40.36 MHz 8/+8 Hz signal from the 6.33 MHz +7/−7 Hz signal and the 46.69 MHz +1/−1 Hz reference signal; and developing the output signal by combining the 6.33 MHz +7/−7 Hz signal and the 40.36 MHz −8/+8 Hz signal.

5. An apparatus for developing an output signal having a frequency tolerance B from an input signal having a frequency tolerance A, comprising:

means for generating a first signal having said frequency tolerance B;

means for combining said input signal and said first signal for developing a second signal having a combined frequency tolerance of −A and B; and means for combining said input signal and said second signal to offset said A frequency tolerance of said input signal with said −A frequency tolerance of said second signal to develop said output signal having said B frequency tolerance.

6. The apparatus of claim 5, wherein a 19.39 MHz +/−20 Hz signal is divided down to generate said input signal at a frequency of 6.33 MHz +/−7 Hz, and wherein said second signal has a frequency of 40.36 MHz +/−7 Hz and further including:

means for dividing a higher frequency reference to generate said first signal at a frequency of 46.69 MHz +/−0 Hz.

* * * * *